United States Patent
Cho et al.

(10) Patent No.: US 12,429,525 B2
(45) Date of Patent: Sep. 30, 2025

(54) DEVICE AND METHOD FOR DETECTING INTERNAL DEFECT OF BATTERY CELL BY USING TDR

(71) Applicant: LG ENERGY SOLUTION, LTD., Seoul (KR)

(72) Inventors: In Hwan Cho, Daejeon (KR); Sang Dae Park, Daejeon (KR); Ju Mi Lee, Daejeon (KR); Ju Young Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/269,219

(22) PCT Filed: Aug. 30, 2022

(86) PCT No.: PCT/KR2022/012971
§ 371 (c)(1),
(2) Date: Jun. 22, 2023

(87) PCT Pub. No.: WO2023/033522
PCT Pub. Date: Mar. 9, 2023

(65) Prior Publication Data
US 2024/0061047 A1     Feb. 22, 2024

(30) Foreign Application Priority Data

Aug. 31, 2021    (KR) .......................... 10-2021-0115841

(51) Int. Cl.
*G01R 31/382*    (2019.01)
*G01N 27/20*    (2006.01)
(Continued)

(52) U.S. Cl.
CPC .......... *G01R 31/382* (2019.01); *G01N 27/20* (2013.01); *G01R 31/11* (2013.01); *G01R 31/389* (2019.01); *G01R 31/392* (2019.01); *G01R 31/52* (2020.01)

(58) Field of Classification Search
CPC .... G01R 31/382; G01R 31/11; G01R 31/392; G01R 31/389; G01R 31/52; G01N 27/20;
(Continued)

(56) References Cited

U.S. PATENT DOCUMENTS

| 2014/0111220 A1 | 4/2014 | Andersen et al. |
| 2014/0272500 A1 | 9/2014 | Roumi et al. |

(Continued)

FOREIGN PATENT DOCUMENTS

| CN | 103733510 A | 4/2014 |
| CN | 104601107 A | 5/2015 |

(Continued)

OTHER PUBLICATIONS

Roy et al., "Detection of Degraded/ Aged Cell in a Li-on Battery Packing using Spread Spectrum Time Domain Reflectometry (SSTDR)", 2020 IEEE Applied Power Electronics Conference and Exposition (APEC), IEEE, Mar. 15, 2020, pp. 1483-1488, XP033784833, DOI: 10.1109/APEC39645.2020.9124341 [Retrieved, Jun. 23, 2020].

(Continued)

*Primary Examiner* — Raul J Rios Russo
(74) *Attorney, Agent, or Firm* — Morgan, Lewis & Bockius LLP (57) ABSTRACT

An apparatus is provided for detecting an internal defect of a battery cell. The apparatus may include a time domain reflectometry (TDR) module configured to apply an electrical pulse to the battery cell and compare a reference waveform with a measurement waveform generated by detecting a reflected wave of the electrical pulse to determine whether (Continued)

a defect has occurred, and a signal line configured to electrically connect the TDR module to an electrode lead of the battery cell. The electrical pulse may be applied in a longitudinal direction of the battery cell. A method of detecting an internal defect of a battery cell is also provided.

17 Claims, 8 Drawing Sheets

(51) Int. Cl.
*G01R 31/11* (2006.01)
*G01R 31/389* (2019.01)
*G01R 31/392* (2019.01)
*G01R 31/52* (2020.01)

(58) Field of Classification Search
CPC .. H01M 10/42; H01M 10/4285; H01M 10/48; H01M 50/178; H01M 50/569; Y02E 60/10; Y02P 70/50
USPC .......................................................... 324/426
See application file for complete search history.

(56) References Cited

U.S. PATENT DOCUMENTS

| | | |
|---|---|---|
| 2014/0300363 A1 | 10/2014 | Thomas et al. |
| 2018/0175429 A1 | 6/2018 | Gottlieb et al. |
| 2019/0140590 A1 | 5/2019 | Yura et al. |
| 2019/0149089 A1 | 5/2019 | Xu et al. |
| 2021/0063457 A1 | 3/2021 | Frommberger et al. |
| 2021/0351428 A1 | 11/2021 | Modderno et al. |
| 2022/0196748 A1* | 6/2022 | Hao .................. H01M 10/4285 |
| 2022/0399587 A1* | 12/2022 | Song .................. H01M 10/425 |
| 2023/0236259 A1* | 7/2023 | Chae .................. G01R 31/396 324/426 |
| 2023/0358819 A1* | 11/2023 | Chae .................. H01M 10/42 |
| 2024/0110990 A1* | 4/2024 | Lee .................. G01R 31/3865 |

FOREIGN PATENT DOCUMENTS

| | | |
|---|---|---|
| CN | 107294492 A | 10/2017 |
| CN | 104422887 B | 12/2017 |
| CN | 207866759 U | 9/2018 |
| CN | 109314488 A | 2/2019 |
| CN | 106153732 B | 4/2019 |
| CN | 111880107 A | 11/2020 |
| JP | 2014-514582 A | 6/2014 |
| JP | 2014-202754 A | 10/2014 |
| JP | 2016-051642 A | 4/2016 |
| JP | 2016-531271 A | 10/2016 |
| JP | 2020-502775 A | 1/2020 |
| JP | 2020-165859 A | 10/2020 |
| KR | 10-2010-0045250 A | 5/2010 |
| KR | 10-2018-0063927 A | 6/2018 |
| KR | 2018-0063927 A | 6/2018 |
| KR | 10-2094539 B1 | 3/2020 |
| KR | 2094539 B1 | 3/2020 |
| KR | 2020-0035594 A | 4/2020 |
| KR | 10-2021-0033851 A | 3/2021 |
| KR | 2265423 B1 | 6/2021 |

OTHER PUBLICATIONS

Extended European Search Report issued in application 22865024.8 dated May 8, 2024 (Previously cited: CN 106153732 A).
International Search Report and Written Opinion dated Dec. 2, 2022 for application PCT/KR2022/012971.
Japanese Office Action issued in application 2023-537371 dated May 20, 2024.
Office Action issued in corresponding Chinese Patent Application No. 202280008406.7, dated Jul. 23, 2025. (Note: KR 10-2094539 B1 was previously cited).
Office Action dated Jul. 7, 2025, issued in corresponding Korean Patent Application No. 10-2021-0115841.

* cited by examiner

DEVICE AND METHOD FOR DETECTING INTERNAL DEFECT OF BATTERY CELL BY USING TDR

TECHNICAL FIELD

The present invention relates to an apparatus and method for detecting an internal defect of a battery cell using time domain reflectometry (TDR).

More particularly, the present invention relates to an apparatus and method for detecting an internal defect of a battery cell, which are capable of quickly and accurately detecting defects that may occur in various inner regions of a battery cell using TDR.

This application claims the benefit of priority based on Korean Patent Application No. 10-2021-0115841, filed on Aug. 31, 2021, and the entire content of the Korean patent application is incorporated herein by reference.

BACKGROUND ART

Recently, rechargeable secondary batteries have been widely used as energy sources of wireless mobile devices. In addition, secondary batteries have attracted attention as energy sources of electric vehicles, hybrid electric vehicles, etc. that have been introduced as a solution to air pollution due to existing gasoline vehicles and diesel vehicles using fossil fuel. Therefore, the types of applications using a secondary battery are diversifying due to the advantages of secondary batteries, and secondary batteries are expected to be applied to more fields and products in the future.

Secondary batteries may be classified into a lithium ion battery, a lithium ion polymer battery, a lithium polymer battery, etc. according to electrodes and a composition of an electrolyte, and among these batteries, the use of the lithium ion polymer battery, which is less prone to leakage of the electrolyte and easy to manufacture, is increasing.

In general, secondary batteries are classified into a cylindrical or prismatic battery in which an electrode assembly is included in a cylindrical or polygonal metal can, and a pouch type battery in which an electrode assembly is included in a pouch-type case of an aluminum laminate sheet according to a shape of a battery case. An electrode assembly included in a battery case is a chargeable and dischargeable power generating device that includes a positive electrode, a negative electrode, and a separator between the positive electrode and the negative electrode. Electrode assemblies are classified into a jelly-roll type formed by interposing a separator between a positive electrode and a negative electrode, which are in the form of a long sheet coated with an active material, and winding a resultant structure, and a stack type in which positive electrodes and negative electrodes each having a certain size are sequentially stacked while a separator is interposed therebetween.

The positive electrode and the negative electrode are formed by applying a positive electrode slurry, which contains a positive electrode active material, on a positive electrode current collector and a negative electrode slurry, which contains a negative electrode active material, on a negative electrode current collector, and drying and rolling resultant structures.

Meanwhile, an electrode tab is formed at one side of the electrode assembly to connect the battery cell to the outside, and an electrode lead is welded onto the electrode tab. The electrode lead is drawn out of the battery case.

However, various defects may occur in the battery cell during the manufacture of electrodes and the assembly of an electrode assembly.

Specifically, a disconnection may occur due cracks in the electrode tab, caused by the difference in elongation between a coated part and a non-coated part, a physical external force applied by welding, or the like. In addition, various defects, such as poor welding between the electrode tab and the electrode lead, cracks in a boundary between a non-coated part and a coated part during the formation of the electrode tab, the growth of a dendrite causing internal short circuit, and damage to a separator during an assembly process, may occur at various locations.

When such a defect occurs, performance degradation may occur to a large extent during the assembly of a battery module or a battery pack including the detect and thus it is important to detect the defect in advance to distinguish a defective battery cell from a normal battery cell. In the related art, a computerized tomography (CT) inspection, an X-ray inspection, an eddy current inspection, or the like is used as a non-destructive inspection. However, when such a method of the related art is used, internal defects can be detected but it will take a considerable time for an inspection, and thus, it is very inefficient to perform a process and the accuracy of the inspection is not high.

Therefore, there is a need to develop a technique for quickly and accurately inspecting a battery cell with an internal defect by a non-destructive method in an actual mass-production process.

RELATED ART LITERATURE

Patent Document

Japanese Patent Laid-Open Publication No. 2020-165859

DISCLOSURE

Technical Problem

To address the above-described problem, the present invention is directed to providing an apparatus and method for detecting an internal defect of a battery cell, which are capable of quickly and accurately detecting various internal defects of a battery cell in an actual mass production process.

Technical Solution

The present invention provides an apparatus for detecting an internal defect of a battery cell having a structure in which an electrode assembly including at least one electrode tab on one side or both sides thereof is accommodated in a battery case and the at least one electrode tab is connected to an electrode lead drawn out of the battery case, the apparatus including a time domain reflectometry (TDR) module configured to apply an electrical pulse to the battery cell and compare a reference waveform with a measurement waveform generated by detecting a reflected wave of the electrical pulse to determine whether a defect has occurred, and a signal line configured to electrically connect the TDR module to the electrode lead of the battery cell, wherein the electrical pulse is applied in a longitudinal direction of the battery cell.

For example, the TDR module may include an electrical pulse generator configured to generate the electrical pulse to be applied to the battery cell, a reflected wave detector configured to detect the reflected wave of the electrical pulse, and a determiner configured to generate the measurement waveform using the reflected wave of the electrical pulse detected by the reflected wave detector, compare the measurement waveform with the reference waveform, and determine that a defect has occurred when an offset between the measurement waveform and the reference waveform occurs.

When a change rate of an impedance represented by the measurement waveform compared to the reference waveform is 10% or more, it may be determined that there is an offset representing the occurrence of a defect.

A measurement waveform generated for each region of the battery cell in a longitudinal direction of the battery cell may be compared with the reference waveform to determine whether a defect has occurred in each region of the battery cell.

In this case, the regions of the battery cell may include a welded portion between the electrode tab and the electrode lead of the battery cell that are bonded by welding, an electrode tab portion on which the electrode tab is positioned, a coated portion coated with the electrode active material, and a boundary portion that is a boundary region between the electrode tab and the coated portion.

Specifically, the reference waveform may be a measurement waveform generated by applying an electrical pulse to a normal battery cell and detecting a reflected wave of the electrical pulse.

As a specific example, the TDR module may include a first TDR module configured to apply an electrical pulse signal through a first electrode lead, and a second TDR module configured to sequentially apply an electrical pulse signal through a second electrode lead, and the signal line may include a first signal line configured to electrically connect the first electrode lead to the first TDR module, and a second signal line configured to electrically connect the second electrode lead to the second TDR module.

For example, the apparatus may further include a ground line configured to electrically connect a ground surface on which the battery cell is disposed to the TDR module.

As a specific example, the battery cell may be disposed parallel to the ground surface in the longitudinal direction.

The apparatus may further include a fixing member configured to fix the electrode lead of the battery cell.

The present invention also provides a method of detecting an internal defect of a battery cell.

The method of detecting an internal defect of a battery cell includes applying an electrical pulse to a battery cell by a time domain reflectometry (TDR) module through a signal line electrically connected to an electrode lead of the battery cell, generating a measurement waveform by the TDR module by detecting a reflected wave, which is generated as the electrical pulse propagates in a longitudinal direction of the battery cell, through the signal line, and detecting whether a defect has occurred by comparing the measurement waveform generated by the TDR module with a reference waveform.

In this case, the detecting of whether a defect has occurred may include determining that a defect has occurred when an offset between the measurement waveform and the reference waveform occurs.

In addition, the TDR module may compare a measurement waveform generated for each region of the battery cell in the longitudinal direction of the battery cell with the reference waveform to determine whether a defect has occurred in each region of the battery cell. In this case, the regions of the battery cell may include a welded portion between an electrode tab and an electrode lead of the battery cell that are bonded by welding, an electrode tab portion on which the electrode tab is positioned, a coated portion coated with the electrode active material, and a boundary portion that is a boundary region between the electrode tab and the coated portion.

As a specific example, the method may further include applying an electrical pulse to the battery cell by the TDR module through a signal line connected to an electrode lead of a normal battery cell, generating a measurement waveform by the TDR module by detecting a reflected wave, which is generated as the electrical pulse propagates in the longitudinal direction of the battery cell, through the signal line, and setting the measurement waveform to the reference waveform.

Advantageous Effects

According to the present invention, various internal defects of a battery cell can be quickly and accurately detected using time domain reflectometry (TDR) in an actual mass-production process without disassembling the battery cell.

In addition, according to the present invention, an inspection can be quickly performed during the manufacture of a battery cell, and an internal defect of a battery cell can be quickly checked in a recycle or reuse operation of re-using a finished battery cell used for a certain period. Accordingly, it is possible to conveniently determine whether to reuse a battery cell by quickly checking a defect of the battery cell for recycling the battery cell.

DETAILED DESCRIPTION OF THE EMBODIMENTS

Hereinafter, the present invention will be described in detail. First, the terms or expressions used in the present specification and claims should not be construed as being limited to as generally understood or as defined in commonly used dictionaries, and should be understood according to meanings and concepts matching corresponding to the present invention on the basis of the principle that the inventor(s) of the application can appropriately define the terms or expressions to optimally explain the present invention.

It should be understood that the terms "comprise" and/or "comprising," when used herein, specify the presence of stated features, integers, steps, operations, elements, components, or a combination thereof, but do not preclude the presence or addition of one or more features, integers, steps, operations, elements, components, or a combination thereof.

It should be understood that when a component such as a layer, a film, a region, a plate or the like is referred to as being "on" another component, the component is "right on" the other component or another component is interposed between these components. It should be understood that when a component such as a layer, a film, a region, a plate or the like is referred to as being "below" another component, the component is "right below" the other component or another component is interposed between these components. In the present specifications, it should be understood that when a component is referred to as being "on" another component, the component is on or below the other component.

As used herein, a "longitudinal direction" of a battery cell should be understood to mean a direction in which an electrode tab is drawn out, and a "width direction" should be understood to mean a direction perpendicular to the longitudinal direction.

The present invention provides an apparatus for detecting an internal defect of a battery cell having a structure in which an electrode assembly including at least one electrode tab on one side or both sides thereof is accommodated in a battery case and the at least one electrode tab is connected to an electrode lead drawn out of the battery case, the apparatus including a time domain reflectometry (TDR) module configured to apply an electrical pulse to the battery cell and compare a reference waveform with a measurement waveform generated by detecting a reflected wave of the electrical pulse to determine whether a defect has occurred, and a signal line configured to electrically connect the TDR module and the electrode lead of the battery cell to each other, wherein the electrical pulse is applied in a longitudinal direction of the battery cell.

As described above, a method of detecting an internal defect of a battery cell of the related art is difficult to be applied to an actual process, because it will take a considerable time to conduct an inspection, it is very inefficient to perform a process, and the accuracy of an inspection is not high.

In contrast, the present invention is characterized in that a TDR module capable of applying an electrical pulse through an electrode lead of a battery cell and detecting an internal defect of the battery cell using a measurement waveform generated by detecting a reflected wave of the electrical pulse. Because the electrical pulse propagates in a longitudinal direction of the battery cell, internal defects in various regions of the battery cell in the longitudinal direction can be detected.

The TDR module detects whether a defect has occurred, based on a principle that a reflection phenomenon occurs when an electrical pulse propagating in the longitudinal direction of the battery cell reaches a location in the battery cell at which a change in impedance occurs. That is, when the battery cell has an internal defect, a change in impedance occurs differently, thus changing a point in time when a reflected wave is generated from an electrical pulse and arrival time of the reflected wave. Using this point, whether the battery cell has a defect and a position of the defect may be identified by deriving a measurement waveform representing an impedance over time from the reflected wave and comparing the measurement waveform with a reference waveform.

The above-described components of the present invention will be described in more detail using the accompanying drawings and embodiments. In describing each drawing, similar reference numerals are used for similar elements. In the accompanying drawings, the dimensions of structures are exaggerated for clarity. Terms such as first and second may be used to describe various components but the components should not be limited by these terms. The terms are only used to distinguish one component from another. For example, a first component may be referred to as a second component without departing from the scope of the present invention, and similarly, a second component may also be referred to as a first component. As used herein, the singular expressions are intended to include plural forms as well, unless the context clearly dictates otherwise.

The present invention will be described in detail below.

EMBODIMENTS OF THE PRESENT INVENTION

First Embodiment

Figure 1:
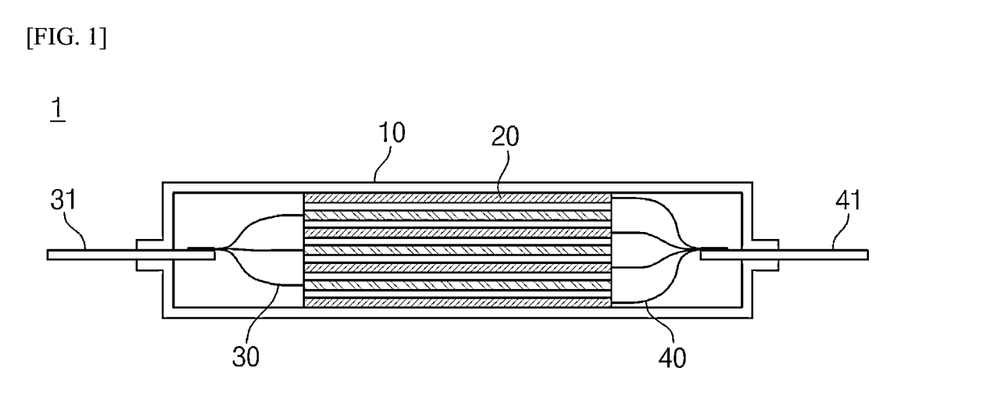
FIG. 1 is a cross-sectional view of a structure of a general battery cell.

FIG. 1 is a cross-sectional view of a structure of a general battery cell.

Referring to FIG. 1, a battery cell 1 has a structure in which an electrode assembly 20 having at least one electrode tab, e.g., electrode tabs 30 and 40, on one side or both sides thereof is accommodated in a battery case 10 and the electrode tabs 30 and 40 are connected to electrode leads 31 and 41 drawn out of the battery case 10. For example, the electrode leads 31 and 41 include a positive electrode lead 31 and a negative electrode lead 41, and the positive electrode lead 31 and the negative electrode lead 41 may be drawn in opposite directions from the battery case 10, but the structures of the electrode leads 31 and 41 are not limited thereto. The electrode assembly and the components thereof are well-known to ordinary technicians, and thus a detailed description thereof is omitted here.

Figure 2:
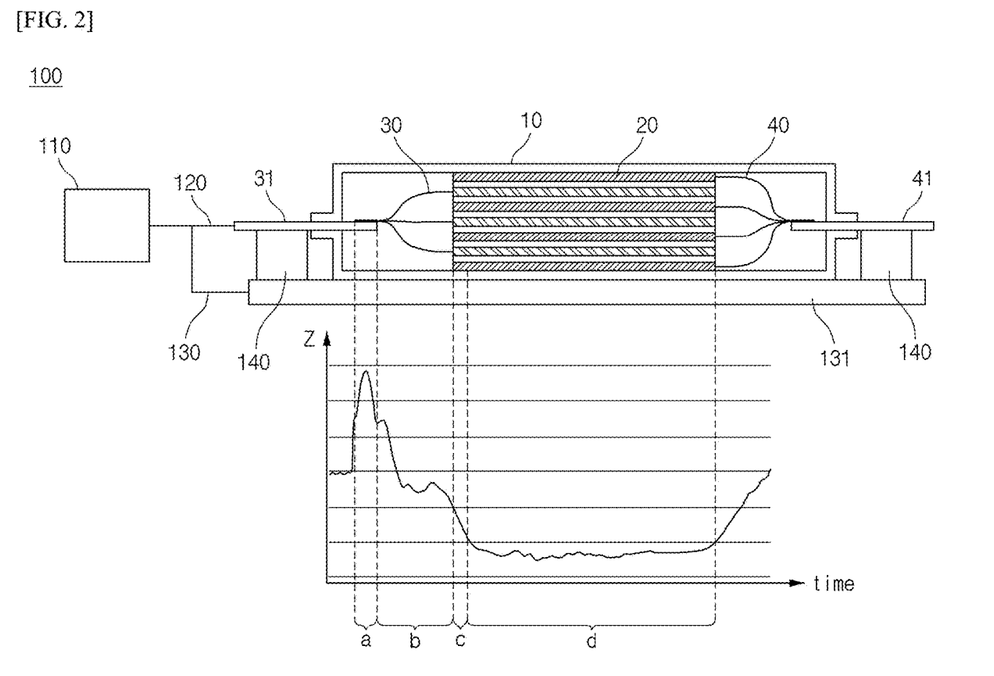
FIG. 2 is a schematic diagram illustrating an apparatus for detecting an internal defect of a battery cell and a measurement waveform according to an embodiment of the present invention.
Figure 3:
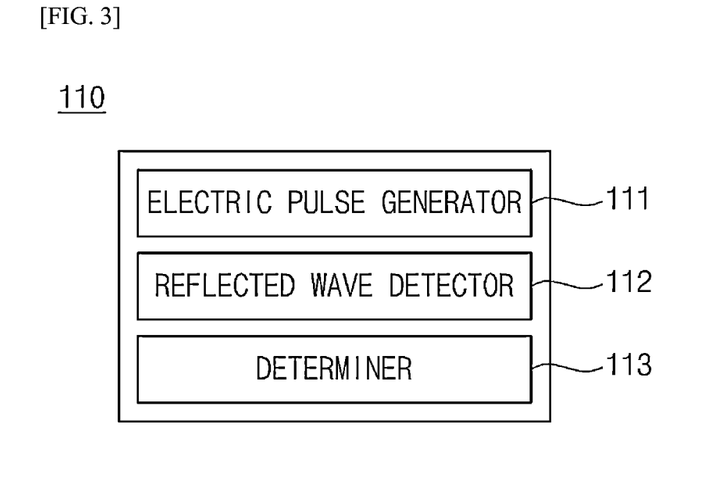
FIG. 3 is a block diagram illustrating a configuration of a time domain reflectometry (TDR) module according to an embodiment of the present invention.

FIG. 2 is a schematic diagram illustrating an apparatus 100 for detecting an internal defect of a battery cell and a measurement waveform according to a first embodiment of the present invention. FIG. 3 is a block diagram illustrating a configuration of a TDR module 110 according to the first embodiment of the present invention.

Referring to FIG. 2, the apparatus 100 for detecting an internal defect of a battery cell according to the present invention includes a TDR module 110 for applying an electrical pulse to a battery cell and comparing a measurement waveform generated by detecting a reflected wave of the electrical pulse with a reference waveform to determine whether a defect has occurred, and a signal line 120 for electrically connecting the TDR module 110 to an electrode lead 31 of the battery cell, wherein the battery cell has a structure in which an electrode assembly 20 including at least one electrode tab, e.g., electrode tabs 30 and 40, on both sides thereof is accommodated in a battery case 10 and the electrode tabs 30 and 40 are connected to electrode leads 31 and 41 drawn out of the battery case 10. In this case, a reflected wave occurs as the electrical pulse propagates in a longitudinal direction of the battery cell.

FIG. 2 illustrates a case in which the TDR module 110 applies an electrical pulse signal through the electrode lead 31 which is a positive electrode lead. However, the TDR module 110 may apply an electrical pulse signal through the electrode lead 41 which is a negative electrode lead, and in this case, the TDR module 110 is electrically connected to the negative electrode lead 41 through a signal line.

The TDR module 110 generates an electrical pulse and generates a measurement waveform from a reflected wave of the electrical pulse to detect whether a defect has occurred.

Specifically, referring to FIG. 3, the TDR module 110 includes an electrical pulse generator 111 for generating an electrical pulse to be applied to the battery cell, a reflected wave detector 112 for detecting a reflected wave of the electrical pulse, and a determiner 113 for generating a measurement waveform from the reflected wave of the electrical pulse detected by the reflected wave detector 112, comparing the measurement waveform with a reference waveform, and determining that a defect has occurred when a result of the comparison reveals that there is an offset.

More specifically, the electrical pulse generator 111 may generate an electrical pulse and apply the electrical pulse to the battery cell at a certain time interval. The time interval may be determined to be a time required for the electrical pulse to be transmitted to and returned from the position of a defect of a battery cell to be checked. For example, in order to detect whether all regions of the battery cell in the longitudinal direction are defective, the time interval may be determined to be a time required for the electrical pulse to travel between the TDR module 110, which applies an electrical pulse, and the negative electrode lead 41 to which the TDR module 110 is not connected.

The reflected wave detector 112 may detect a reflected wave reflected from various internal components of the battery cell as an electrical pulse signal supplied from the electrical pulse generator 111 propagates in the longitudinal direction of the battery cell. That is, by measuring a reflected wave of the electrical pulse, a change in impedance generated while an electrical pulse applied to the battery cell by the TDR module 110 travels back and forth in the battery cell may be checked.

The determiner 113 generates a measurement waveform from the reflected wave of the electrical pulse detected by the reflected wave detector 112. The measurement waveform represents an impedance of the reflection signal of the electrical pulse over time. A measurement waveform may be represented by plotting time on a horizontal axis and an impedance on a vertical axis. The measurement waveform shown in FIG. 2 represents an impedance Z over time.

The determiner 113 may compare the generated measurement waveform with the reference waveform and determine that a defect has occurred when an offset between the measurement waveform and the reference waveform occurs. In this case, it may be understood that when there is an offset, the measurement waveform and the reference waveform do not match each other and a change rate of an impedance of the measurement waveform compared to the reference waveform is 10% or more.

The reference waveform may be a measurement waveform generated by applying an electrical pulse to a normal battery cell and detecting a reflected wave of the electrical pulse. It is determined that a defect has occurred when a result of generating a measurement waveform for a battery cell to be detected in the same manner as a normal battery cell and comparing the measurement waveform with the reference waveform reveals that there is an offset.

As described above, in order to detect whether all regions of the battery cell in the longitudinal direction are defective, an electrical pulse is applied by setting the time interval to a time required for the electrical pulse to travel between the TDR module 110 applying the electrical pulse and the negative electrode lead 41 to which the TDR module 110 is not connected and be returned to the TDR module 110. Therefore, as shown in FIG. 2, a measurement waveform for each region of the battery cell in the longitudinal direction may be generated. The regions of the battery cell include a welded portion a on which the electrode tab 30 and the electrode lead 31 of the battery cell are bonded by welding, an electrode tab portion b on which the electrode tab 30 is positioned, a coated portion d coated with an electrode active material, and a boundary portion c that is a boundary region between the electrode tab portion b and the coated portion d. In this case, the measurement waveform generated for each region of the battery cell may be compared with the reference waveform to detect whether a defect has occurred in each region of the battery cell. That is, because a region of the battery cell in which an offset has been generated can be checked, not only whether a defect has occurred but also a position of the defect can be detected.

The signal line 120 electrically connects the TDR module 110 and the battery cell through the electrode lead 31. Specifically, the electrical pulse generated by the electrical pulse generator 111 of the TDR module 110 passes through the signal line 120 and thereafter is applied to the battery cell through the electrode lead 31 of the battery cell. In addition, a reflected wave generated from the applied electrical pulse in the battery cell sequentially passes through the electrode lead 31 and the signal line 120 of the battery cell and thereafter is transmitted to the reflected wave detector 112 of the TDR module 110.

Meanwhile, the battery cell is disposed on a ground surface 131, and the ground surface 131 and the TDR module 110 are electrically connected to each other by a ground line 130. By providing the ground surface 131 and the ground line 130, it is possible to prevent the occurrence of an accident when an electrical pulse propagates to the outside other than the inside of the battery cell due to an unexpected cause. That is, the TDR module 110 may safely apply an electrical pulse to the battery cell.

In this case, the battery cell may be disposed parallel to the ground surface 131 in the longitudinal direction. When the battery cell is not disposed parallel to the ground surface 131, it is difficult to accurately apply an electrical pulse from the TDR module 110 in the longitudinal direction of the battery cell, and thus a measurement waveform may not be difficult to be generated accurately. That is, when the battery cell is disposed parallel to the ground surface 131 in the longitudinal direction, the accuracy of detecting an internal defect of the battery cell can increase.

A fixing member 140 may further be provided to fix the electrode leads 31 and 41 of the battery cell so as to stably fix the battery cell. As shown in FIG. 2, when the battery cell is disposed on the ground surface 131, there is a space between the ground surface 131 and the electrode leads 31 and 41. Accordingly, the positions of the electrode leads 31 and 41 and the battery cell are likely to be changed when an external impact or an electrical pulse is applied to the battery cell. Therefore, the battery cell and the TDR module 110 may be disconnected from each other. Accordingly, the fixing member 140 may further be provided in a space between the ground surface 131 and the electrode leads 31 and 41 to fix the electrode leads 31 and 41, thereby preventing the battery cell and the TDR module 110 from being disconnected from each other. That is, an internal defect of the battery cell can be stably detected. In FIG. 2, the fixing member 140 is provided in the space between the ground surface 131 and the electrode leads 31 and 41 to support lower surfaces of the electrode leads 31 and 41. However, a shape of the fixing member 140 is not particularly limited as long as the electrode leads 31 and 41 are capable of being fixed by the fixing member 140. For example, the fixing member 140 may protrude from the ground surface 131 to support opposite side surfaces of each of the electrode leads 31 and 41.

Second Embodiment

Figure 4A:
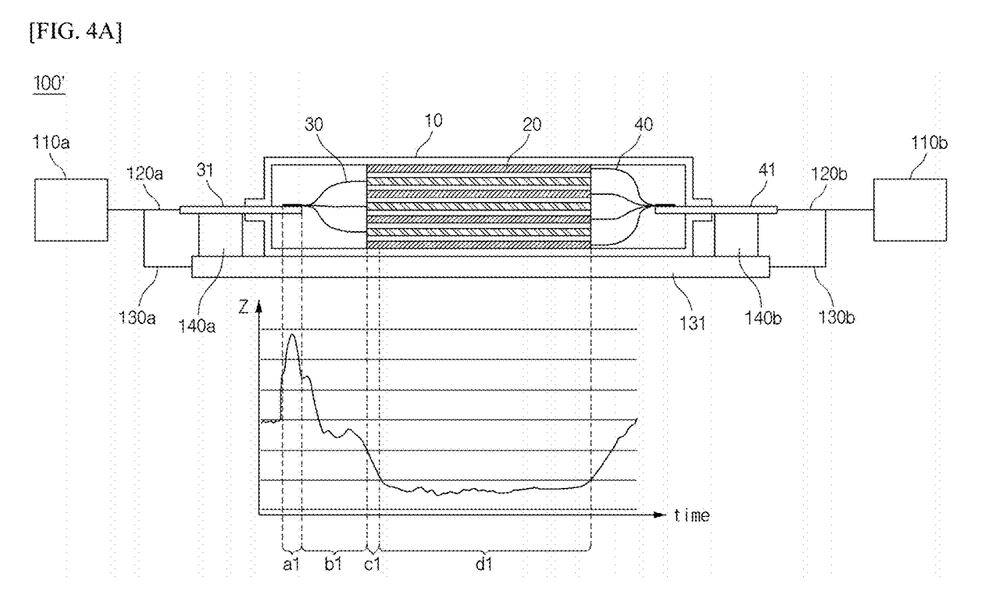
FIGS. 4A and 4B are schematic diagrams illustrating an apparatus for detecting an internal defect of a battery cell and a measurement waveform according to another embodiment of the present invention.
Figure 4B:
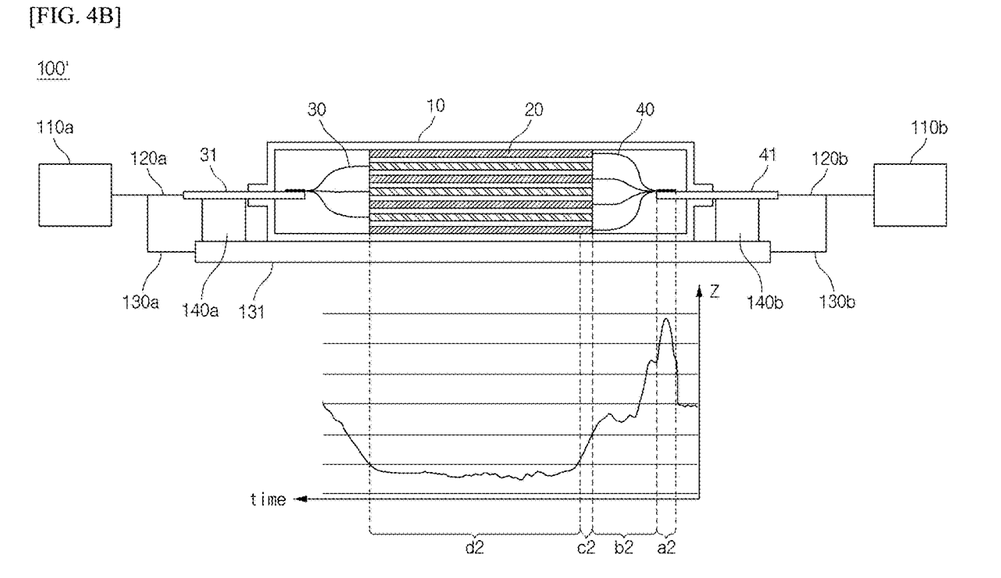

FIGS. 4A and 4B are schematic diagrams illustrating an apparatus 100' for detecting an internal defect of a battery cell and a measurement waveform according to second embodiment of the present invention. Specifically, FIG. 4A illustrates that an electrical pulse is applied from a first TDR module 110a connected to a positive electrode lead 31 through a first signal line 120a and a measurement waveform is generated from a reflected wave of the electrical pulse. Meanwhile, FIG. 4B illustrates that an electrical pulse is applied from a second TDR module 110b connected to a negative electrode lead 41 through a second signal line 120b and a measurement waveform is generated from a reflected wave of the electrical pulse. In this case, the measurement waveforms shown in FIGS. 4A and 4B each represent an impedance Z over time.

The second embodiment is different from the first embodiment in that a TDR module 110 of an apparatus 100' for detecting an internal defect of a battery cell of the present embodiment includes the first TDR module 110a for applying an electrical pulse through the positive electrode lead 31 and the second TDR module 110b for applying an electrical pulse through the negative electrode lead 41, and the signal line 120 includes the first signal line 120a for electrically connecting the positive electrode lead 31 to the first TDR module 110a and the second signal line 120b for electrically connecting the negative electrode lead 41 to the second TDR module 110b. That is, the second embodiment is different from the first embodiment in that the first TDR module 110a and the second TDR module 110b respectively electrically connected to the first signal line 120a and the second signal line 120b sequentially apply electrical pulses to the positive electrode lead 31 and the negative electrode lead 41, respectively. In the second embodiment, components that are the same as those of the first embodiment are assigned the same reference numerals, and a detailed description thereof is omitted here.

In the present embodiment, the second TDR module 110b electrically connected to the negative electrode lead 41 through the second signal line 120b are further provided, as well as the first TDR module 110a electrically connected to the positive electrode lead 31 through the first signal line 120a. In this case, the first TDR module 110 *a* applies an electrical pulse through the positive electrode lead 31 and thereafter the second TDR module 110 *b* sequentially applies an electrical pulse through the negative electrode lead 41. When the electrical pulses are applied simultaneously by the first and second TDR modules 110a and 110b, interference may occur between the electrical pulses, thus making it difficult to accurately a measurement waveform.

Meanwhile, by sequentially applying an electrical pulse to both the positive electrode lead 31 and the negative electrode lead 41, a measurement waveform and a reference waveform may be generated for each of all inner regions of the battery cell and compared with each other to detect whether there is a defect. As in the first embodiment, even when an electrical pulse is applied to only the positive electrode lead 31, the electrical pulse propagates to the negative electrode lead 41. However, the electrical pulse may be difficult to completely reach the vicinity of the negative electrode lead 41 far from the TDR module 110 and thus a measurement waveform generated from a reflected wave may not be accurate. Accordingly, when an electrical pulse is applied to the negative electrode lead 41 through the second TDR module 110b, an accurate measurement waveform may also be generated for all regions of a negative electrode. That is, an accurate measurement waveform may be generated for all inner regions of the battery cell.

First, as in the first embodiment, an electrical pulse may be applied to the positive electrode lead 31 to detect defects in all regions of a positive electrode in the longitudinal direction of the battery cell. Specifically, as shown in FIG. 4A, defects present in a positive electrode welded portion a1 between a positive electrode tab 30 and the positive electrode lead 31 that are bonded by welding, a positive electrode tab portion b1 on which the positive electrode tab 30 is disposed, a positive electrode coated portion d1 that is a region coated with a positive electrode active material, and a positive electrode boundary portion c1 that is a boundary region between the positive electrode tab portion b1 and the positive electrode coated portion d1 may be detected. Thereafter, an electrical pulse may be applied to the negative electrode lead 41 to detect defects in all of the regions of the negative electrode in the longitudinal direction of the battery cell. Specifically, as shown in FIG. 4B, defects present in a negative electrode welded portion a2 between a negative electrode tab 40 and the negative electrode lead 41 that are bonded by welding, a negative electrode tab portion b2 on which the negative electrode tab 40 is disposed, a negative electrode coated portion d2 that is a region coated with a negative electrode active material, and a negative electrode boundary portion c2 that is a boundary region between the negative electrode tab portion b2 and the negative electrode coated portion d2 may be detected.

In the present embodiment, a case in which the first TDR module 110a applies an electrical pulse to the positive electrode and thereafter the second TDR module 110b applies an electrical pulse to the negative electrode has been described. However, an order of applying an electrical pulse is not particularly limited, and an electrical pulse may be applied to the negative electrode and thereafter be applied to the positive electrode.

The present invention also provides a method of detecting an internal defect of a battery cell.

Figure 5:
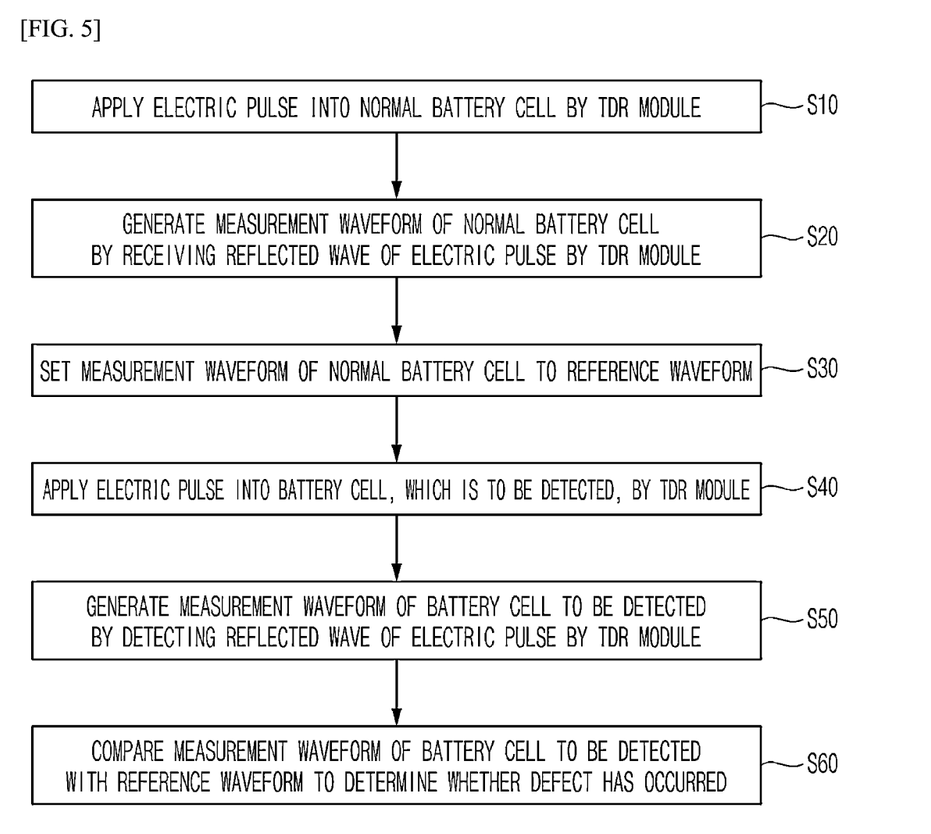
FIG. 5 is a flowchart of a method of detecting an internal defect of a battery cell according to an embodiment of the present invention.

FIG. 5 is a flowchart of a method of detecting an internal defect of a battery cell according to an embodiment of the present invention.

First, a reference waveform is generated as a criterion for determining whether a defect has occurred. Specifically, the method may include applying an electrical pulse to a normal battery cell by a TDR module through a signal line electrically connected to an electrode lead of the normal battery cell (S10), generating a measurement waveform by detecting a reflected wave, which is generated as the electrical pulse propagates in a longitudinal direction of the normal battery cell, by the TDR module through the signal line (S20), and setting the measurement waveform to a reference waveform (S30).

Next, a measurement waveform of a battery cell to be detected is generated in the same manner as the reference waveform generated with respect to the normal battery cell. Specifically, the method may further include applying an electrical pulse to the battery cell by the TDR module through a signal line electrically connected to an electrode lead of the battery cell (S40), generating a measurement waveform by detecting a reflected wave, which is generated as the electrical pulse propagates in the longitudinal direction of the battery cell, by the TDR module through the signal line (S50), and comparing the generated measurement waveform with the reference waveform by the TDR module to determine whether a defect has occurred (S60).

In this case, in the detection of whether a defect has occurred, it is determined that a defect has occurred when a result of comparing the measurement waveform with the reference waveform reveals that there is an offset.

In addition, the TDR module compares a measurement waveform generated for each region of the battery cell in the longitudinal direction of the battery cell with the reference waveform to determine whether a defect has occurred in each region of the battery cell. The regions of the battery cell may include a welded portion between an electrode tab and an electrode lead of the battery cell that are bonded by welding, an electrode tab portion on which an electrode tab is positioned, a coated portion coated with the electrode active material, and a boundary portion that is a boundary region between the electrode tab and the coated portion.

EXAMPLE

A normal battery cell was manufactured to have a structure in which an electrode assembly having positive electrode tabs at one side and negative electrode tabs at another side is accommodated in a battery case and the positive electrode tabs and the negative electrode tabs are respectively connected to a positive electrode lead and a negative electrode lead drawn out of the battery case.

Comparative Example 1

A battery cell was manufactured in the same manner as the Example excluding that only some of positive electrode tabs were welded onto a positive electrode lead to cause damage to a welded portion between the electrode tabs and an electrode lead that were bonded by welding.

Comparative Example 2

A battery cell was manufactured in the same manner as the Example, excluding that external impact was applied to a positive electrode tab portion on which positive electrode tabs are located to cause cracks to occur in at least one of the positive electrode tabs.

Comparative Example 3

A battery cell was manufactured in the same manner as the Example, excluding that a positive electrode active material applied on a boundary portion, which is a boundary portion between positive electrode tabs and a positive electrode coated portion coated with the positive electrode active material, was partially removed.

Comparative Example 4

A battery cell was manufactured in the same manner as the Example, excluding that a nail penetrates a coated portion coated with a positive electrode active material to cause internal short circuit between a positive electrode and a negative electrode.

Experimental Example

A measurement waveform of a normal battery cell of Example was generated by the apparatus for detecting a defect of a battery cell of the first embodiment shown in FIG. 2 and set as a reference waveform. Measurement waveforms of the battery cells of Comparative Examples 1 to 4 were generated in the same manner and compared with the reference waveform. In this case, the reference waveform and the measurement waveform are represented as impedances over time.

Figure 6A:
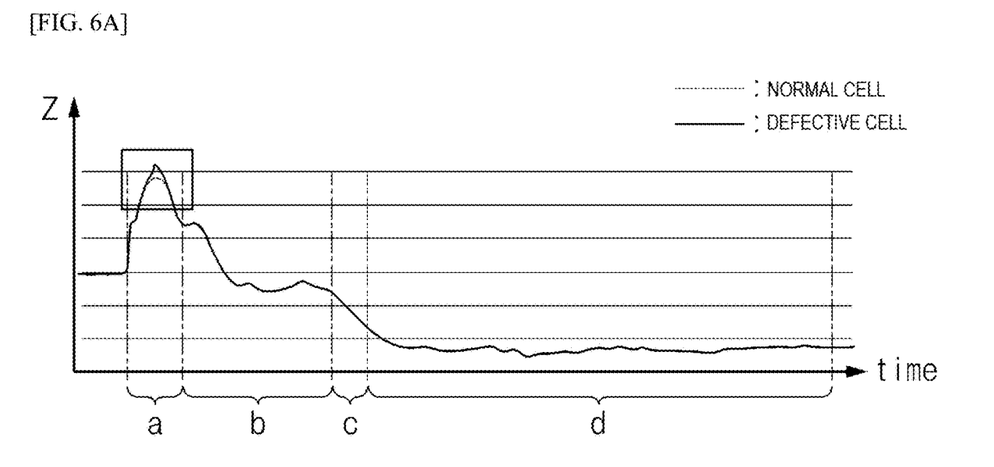
FIGS. 6A to 6D are graphs showing a measurement waveform generated by the apparatus for detecting an internal defect of a battery cell according to the embodiment of FIG. 2.

FIG. 6A illustrates a result of comparing a measurement waveform of the battery cell of Comparative Example 1 with a reference waveform using the apparatus 100 for detecting a defect of a battery cell of the first embodiment. As shown in FIG. 6A, it can be confirmed that a measurement waveform having an impedance greater by 10% or more than an impedance of the reference waveform appeared on the welded portion a of the battery cell. Accordingly, a defect of the welded portion a of the battery cell of Comparative Example 1 was detected.

Figure 6B:
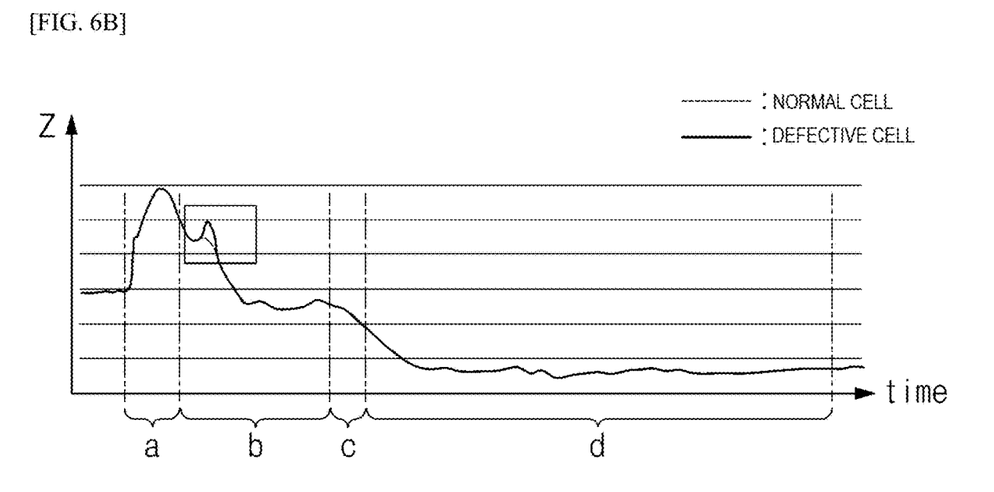

FIG. 6B illustrates a result of comparing a measurement waveform of the battery cell of Comparative Example 2 with the reference waveform using the apparatus 100 for detecting a defect of a battery cell of the first embodiment. As shown in FIG. 6B, it can be confirmed that a measurement waveform having an impedance greater by 10% or more than the impedance of the reference waveform appeared on the electrode tab portion b of the battery cell. Accordingly, a defect of the electrode tab portion b of the battery cell of Comparative Example 2 was detected.

Figure 6C:
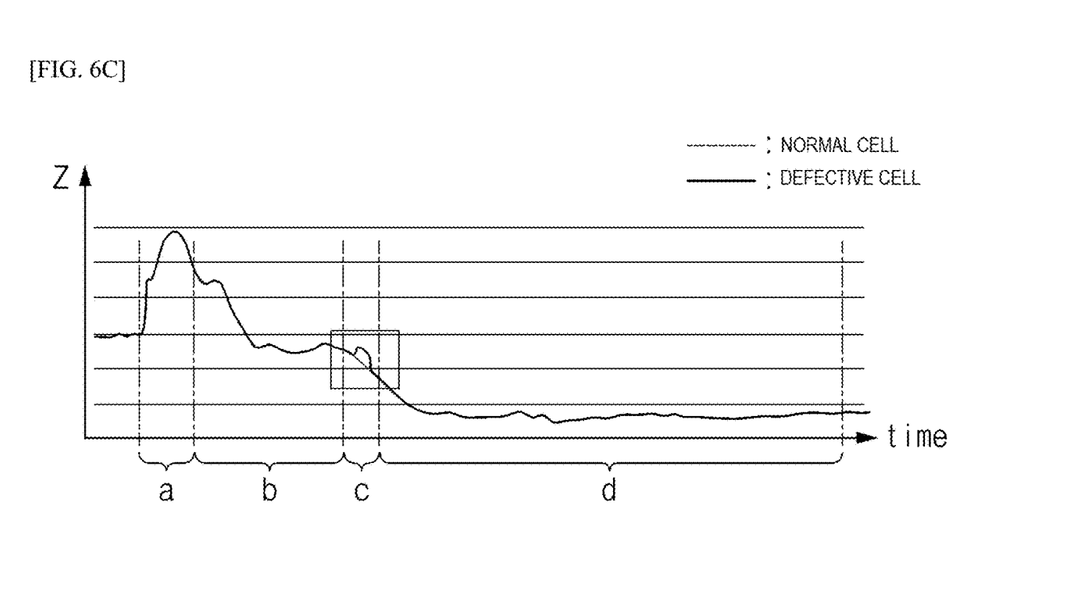

FIG. 6C illustrates a result of comparing a measurement waveform of the battery cell of Comparative Example 3 with the reference waveform using the apparatus 100 for detecting a defect of a battery cell of the first embodiment. As shown in FIG. 6C, it can be confirmed that a measurement waveform having an impedance greater by 10% or more than the impedance of the reference waveform appeared on the boundary portion c of the battery cell. Accordingly, a defect of the boundary portion c of the battery cell of Comparative Example 3 was detected.

Figure 6D:
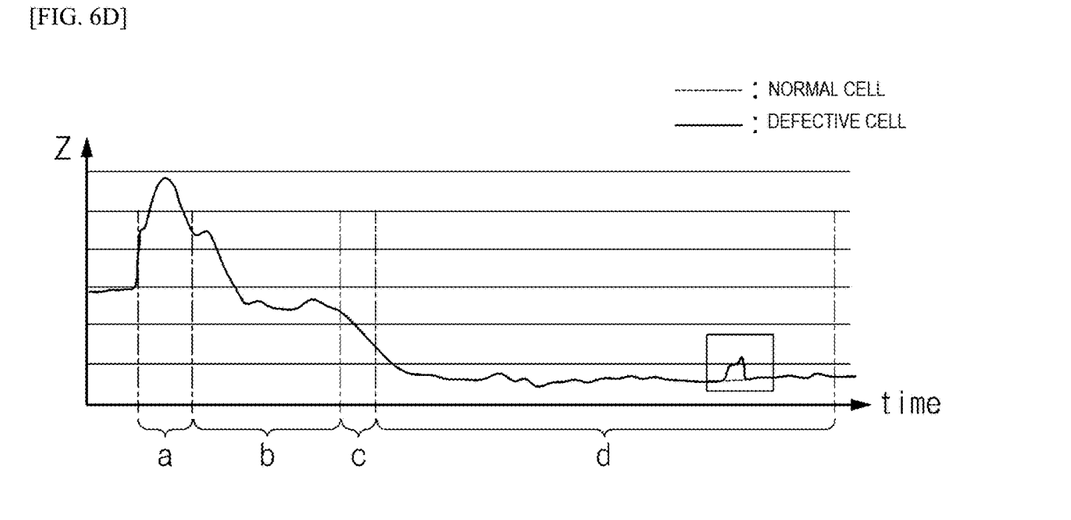

FIG. 6D illustrates a result of comparing a measurement waveform of the battery cell of Comparative Example 4 with the reference waveform using the apparatus 100 for detecting a defect of a battery cell of the first embodiment. As shown in FIG. 6D, it can be confirmed that a measurement waveform having an impedance greater by 10% or more than the impedance of the reference waveform appeared on the holding portion d of the battery cell. Accordingly, a defect of the holding portion d of the battery cell of Comparative Example 4 was detected.

As described above, according to the present invention, various internal defects of a battery cell can be quickly and accurately detected using TDR in an actual mass-production process without disassembling the battery cell.

In addition, according to the present invention, an inspection can be quickly performed during the manufacture of a battery cell, and an internal defect of a battery cell can be quickly checked in a recycle or reuse operation of re-using a finished battery cell used for a certain period. Accordingly, it is possible to conveniently determine whether to reuse a battery cell by quickly checking a defect of the battery cell for recycling the battery cell.

The above description is only an example of the technical idea of the present invention and various modification and changes may be made by those of ordinary skill in the technical field to which the present invention pertains without departing from the essential features of the present invention. Therefore, the drawings of the present invention set forth herein are intended not to limit the technical idea of the present invention but to describe the technical idea, and the scope of the technical idea of the present invention is not limited by the drawings. The scope of protection for the present invention should be interpreted based on the following claims and all technical ideas within the same scope as the present invention should be interpreted as being included in the scope of the present invention.

In the present specification, terms representing directions such as upper, lower, left, right, forward and backward directions are used only for convenience of description and thus it will be obvious that these terms may be changed according to a position of an object or an observer.

REFERENCE NUMERALS

1: battery cell
10: battery case
20: electrode assembly
30: first electrode (positive electrode) tab
31: first electrode lead
40: second electrode (negative electrode) tab
41: second electrode lead
100, 100': apparatus for detecting internal defect of battery cell
110: TDR module
111: electrical pulse generator
112: reflected wave detector
113: determiner
120: signal line
130: ground line
131: ground surface
140: fixing member

The invention claimed is:

1. An apparatus for detecting an internal defect of a battery cell having a structure in which an electrode assembly including at least one electrode tab on one side or both sides of the electrode assembly is accommodated in a battery case, and the at least one electrode tab is connected to an electrode lead drawn out of the battery case, the apparatus comprising:
a time domain reflectometry (TDR) module including an electrical pulse generator, a reflected wave detector and a determiner and configured to apply an electrical pulse to the battery cell and compare a reference waveform with a measurement waveform generated by detecting a reflected wave of the electrical pulse to determine whether a defect has occurred;
a signal line configured to electrically connect the TDR module to the electrode lead of the battery cell;
a ground surface; and
a ground line,
wherein:
the TDR module is configured to apply the electrical pulse in a longitudinal direction of the battery cell;
the ground surface and the TDR module are electrically connected to each other by the ground line; and
the battery cell is disposed on the ground surface that is electrically connected to the TDR module by the ground line.

2. The apparatus of claim 1, wherein:
the electrical pulse generator is configured to generate the electrical pulse to be applied to the battery cell;
the reflected wave detector is configured to detect the reflected wave of the electrical pulse; and
the determiner is configured to generate the measurement waveform from the reflected wave of the electrical pulse detected by the reflected wave detector, compare the measurement waveform with the reference waveform, and determine that the defect has occurred when an offset between the measurement waveform and the reference waveform occurs.

3. The apparatus of claim 2, wherein, when a change rate of an impedance represented by the measurement waveform compared to the reference waveform is 10% or more, it is determined that there is the offset representing the occurrence of the defect.

4. The apparatus of claim 1, wherein the determiner of the TDR module is configured to compare the measurement waveform generated for each region of the battery cell in the longitudinal direction of the battery cell with the reference waveform to determine whether a defect has occurred in each region of the battery cell.

5. The apparatus of claim 4, wherein the regions of the battery cell comprise a welded portion between the at least one electrode tab and the electrode lead of the battery cell that are bonded by welding, an electrode tab portion on which the at least one electrode tab is positioned, a coated portion coated with an electrode active material, and a boundary portion that is a boundary region between the at least one electrode tab and the coated portion.

6. The apparatus of claim 1, wherein the reference waveform comprises a measurement waveform generated by detecting a reflected wave reflected when an electrical pulse is applied to a normal battery cell.

7. The apparatus of claim 1,
wherein the TDR module comprises:
a first TDR module including the electrical pulse generator and configured to apply an electrical pulse signal through a first electrode lead; and
a second TDR module including a second electrical pulse generator and configured to sequentially apply an electrical pulse signal through a second electrode lead, and
wherein the signal line comprises:
a first signal line configured to electrically connect the first electrode lead to the first TDR module; and
a second signal line configured to electrically connect the second electrode lead to the second TDR module.

8. The apparatus of claim 1, wherein the battery cell is disposed parallel to the ground surface in the longitudinal direction.

9. The apparatus of claim 1, further comprising a fixing member configured to fix the electrode lead of the battery cell.

10. The apparatus of claim 1, further comprising:
a fixing member provided in a space between the ground surface and the electrode lead of the battery cell to fix the electrode lead of the battery cell.

11. A method of detecting an internal defect of a battery cell, the method comprising:
providing a ground surface and a ground line;
applying an electrical pulse to the battery cell by an electrical pulse generator of a time domain reflectometry (TDR) module through a signal line electrically connected to an electrode lead of the battery cell, wherein the battery cell is disposed on the ground surface that is electrically connected to the TDR module by the ground line;
generating a measurement waveform by a determiner of the TDR module by detecting a reflected wave using a reflected wave detector, wherein the reflected wave is generated as the electrical pulse propagates in a longitudinal direction of the battery cell, through the signal line; and detecting whether a defect has occurred by comparing the measurement waveform generated by the determiner of the TDR module with a reference waveform.

12. The method of claim 11, wherein the detecting of whether the defect has occurred comprises determining that the defect has occurred when an offset between the measurement waveform and the reference waveform occurs.

13. The method of claim 11, wherein the TDR module compares the measurement waveform generated for each region of the battery cell in the longitudinal direction of the battery cell with the reference waveform to determine whether a defect has occurred in each region of the battery cell.

14. The method of claim 13, wherein the regions of the battery cell comprise a welded portion between an electrode tab and an electrode lead of the battery cell that are bonded by welding, an electrode tab portion on which the electrode tab is positioned, a coated portion coated with an electrode active material, and a boundary portion that is a boundary region between the electrode tab and the coated portion.

15. The method of claim 11, further comprising:
applying an electrical pulse to a normal battery cell by a TDR module through a signal line connected to an electrode lead of the normal battery cell;
generating a measurement waveform by the TDR module for the normal battery cell by detecting a reflected wave, which is generated as the electrical pulse for the normal battery cell propagates in a longitudinal direction of the normal battery cell, through the signal line for the normal battery cell; and
setting the measurement waveform generated for the normal battery cell to the reference waveform.

16. The method of claim 11, wherein the battery cell is disposed parallel to the ground surface in the longitudinal direction.

17. An apparatus for detecting an internal defect of a battery cell having a structure in which an electrode assembly including at least one electrode tab on one side or both sides of the electrode assembly is accommodated in a battery case, and the at least one electrode tab is connected to an electrode lead drawn out of the battery case, the apparatus comprising:
a time domain reflectometry (TDR) module including an electrical pulse generator, a reflected wave detector and a determiner and configured to apply an electrical pulse to the battery cell and compare a reference waveform with a measurement waveform generated by detecting a reflected wave of the electrical pulse to determine whether a defect has occurred; and
a signal line configured to electrically connect the TDR module to the electrode lead of the battery cell,
wherein the TDR module is configured to apply the electrical pulse in a longitudinal direction of the battery cell, and
wherein the TDR module comprises:
a first TDR module including the electrical pulse generator and configured to apply a first electrical pulse signal to a first location of the battery cell; and
a second TDR module including a second electrical pulse generator and configured to apply a second electrical pulse signal to a second location of the battery cell.

* * * * *